(12) United States Patent
Nishino (10) Patent No.: US 10,822,698 B2
(45) Date of Patent: Nov. 3, 2020

(54) SUBSTRATE PROCESSING APPARATUS, RECORDING MEDIUM, AND METHOD OF PROCESSING SUBSTRATES

(71) Applicant: ASM IP Holding B.V., Almere (NL)

(72) Inventor: Teruhide Nishino, Kawasaki (JP)

(73) Assignee: ASM IP Holding B.V., Almere (NL)

( * ) Notice: Subject to any disclaimer, the term of this patent is extended or adjusted under 35 U.S.C. 154(b) by 799 days.

(21) Appl. No.: 14/841,305

(22) Filed: Aug. 31, 2015

(65) Prior Publication Data
US 2017/0057094 A1    Mar. 2, 2017

(51) Int. Cl.
| | | |
|---|---|---|
| *B25J 11/00* | (2006.01) | |
| *B25J 9/16* | (2006.01) | |
| *C23C 16/52* | (2006.01) | |
| *C23C 16/458* | (2006.01) | |
| *C23C 16/50* | (2006.01) | |
| *H01L 21/677* | (2006.01) | |
| *H01L 21/67* | (2006.01) | |

(52) U.S. Cl.
CPC ........ *C23C 16/52* (2013.01); *H01L 21/67196* (2013.01); *H01L 21/67201* (2013.01); *H01L 21/67766* (2013.01)

(58) Field of Classification Search
CPC ................................................. H01L 21/67196
See application file for complete search history.

(56) References Cited

U.S. PATENT DOCUMENTS

| | | | | |
|---|---|---|---|---|
| 3,778,100 A | * | 12/1973 | Dillard ...................... | B60P 3/34 296/164 |
| 2007/0032097 A1 | * | 2/2007 | Chen ................... | H01L 21/6719 438/795 |
| 2012/0305196 A1 | * | 12/2012 | Mori ................. | H01L 21/67167 156/362 |

FOREIGN PATENT DOCUMENTS

JP      2007-294997      * 11/2007    ........... H01L 21/677

* cited by examiner

*Primary Examiner* — Parviz Hassanzadeh
*Assistant Examiner* — Nathan K Ford
(74) *Attorney, Agent, or Firm* — Studebaker & Brackett PC

(57) ABSTRACT

A substrate processing apparatus includes a robot arm for conveying a substrate, a conveyance chamber containing the robot arm, and an adjacent processing unit adjacent to the conveyance chamber, the adjacent processing unit processing a substrate therein. The conveyance chamber is constructed so as to be able to have a first shape for providing a predetermined space between the conveyance chamber and the adjacent processing unit, and a second shape for increasing the internal space of the conveyance chamber by making the distance between the conveyance chamber and the adjacent processing unit smaller than when the first shape is formed.

9 Claims, 10 Drawing Sheets

SUBSTRATE PROCESSING APPARATUS, RECORDING MEDIUM, AND METHOD OF PROCESSING SUBSTRATES

BACKGROUND OF THE INVENTION

Field of the Invention

The present invention relates to a substrate processing apparatus used to form, for example, an electronic device, to a recording medium and to a method of processing substrates.

Background Art

US2012/0305196A1 discloses a substrate processing apparatus provided with a plurality of dual chambers. The dual chamber is a chamber including two reactors. At least one of the plurality of dual chambers is adjacent to an equipment front end module (EFEM) provided to convey substrates.

A robot arm is used to convey substrates one by one. Because the robot arm is contained in a conveyance chamber, the operating range of the robot arm is limited by the conveyance chamber. In some cases, the conveyance chamber is adjacent to a processing unit which is a module for processing substrates. The processing unit is, for example, a reactor chamber.

When a maintenance operation is performed on the processing unit, an operator approaches the processing unit and performs a necessary operation on the processing unit. Securing the safety of the operator requires providing a certain spacing between the conveyance chamber and the processing unit.

The conveyance chamber may be made small to provide a sufficiently large spacing between the conveyance chamber and the processing unit. If the conveyance chamber is made small, the operation of the robot arm in the conveyance chamber is limited, resulting in a reduction in throughput of the robot arm.

On the other hand, if the conveyance chamber is made large, the operating range of the robot arm can be extended and the throughput of the robot arm can therefore be increased. In a case where the conveyance chamber is made large, however, the spacing between the conveyance chamber and the processing unit is insufficient and the safety of the operator at the time of maintenance cannot be secured.

SUMMARY OF THE INVENTION

The present invention has been achieved to solve the above-described problem, and an object of the present invention is to provide a substrate processing apparatus, a recording medium and a method of processing substrates capable of providing a sufficiently large spacing between a conveyance chamber and a processing unit during a time period when a maintenance operation is performed on the processing unit and capable of increasing the throughput of the robot arm during other time periods.

The features and advantages of the present invention may be summarized as follows.

According to one aspect of the present invention, a substrate processing apparatus includes a robot arm for conveying a substrate, a conveyance chamber containing the robot arm, and an adjacent processing unit adjacent to the conveyance chamber, the adjacent processing unit processing a substrate therein. The conveyance chamber is constructed so as to be able to have a first shape for providing a predetermined space between the conveyance chamber and the adjacent processing unit, and a second shape for increasing the internal space of the conveyance chamber by making the distance between the conveyance chamber and the adjacent processing unit smaller than when the first shape is formed.

According to another aspect of the present invention, a recording medium on which a program is recorded and from which the program can be read with a computer, the program causing the computer to execute an examination step of examining whether a conveyance chamber containing a robot arm for conveying a substrate has a first shape or a second shape formed so that the internal space of the conveyance chamber is expanded in comparison with the first shape, and a control step of controlling the robot arm by using as an operating region the internal space of the conveyance chamber defined by the first shape when the first shape is identified in the examination step, and controlling the robot arm by using as an operating region the internal space of the conveyance chamber defined by the second shape when the second shape is identified in the examination step.

According to another aspect of the present invention, a method of processing substrates, includes a maintenance process in which a substrate is conveyed with a robot arm in a conveyance chamber while a maintenance operation is being performed on an adjacent processing unit adjacent to the conveyance chamber, with the conveyance chamber being in a state of having a first shape formed so that a predetermined space is provided between the conveyance chamber and the adjacent processing unit, and an ordinary process in which a substrate is conveyed with the robot arm in the conveyance chamber while a substrate is being processed by the adjacent processing unit, with the conveyance chamber being in a state of having a second shape for increasing the internal space of the conveyance chamber by reducing the distance between the conveyance chamber and the adjacent processing unit in comparison with the first shape.

Other and further objects, features and advantages of the invention will appear more fully from the following description.

DETAILED DESCRIPTION OF THE PREFERRED EMBODIMENTS

A substrate processing apparatus, a recording medium and a method of processing substrates according to an embodiment of the present invention will be described with reference to the accompanying drawings. Components identical or corresponding to each other are indicated by the same reference characters and repeated description of them may be omitted in some cases.

First Embodiment

Figure 1:
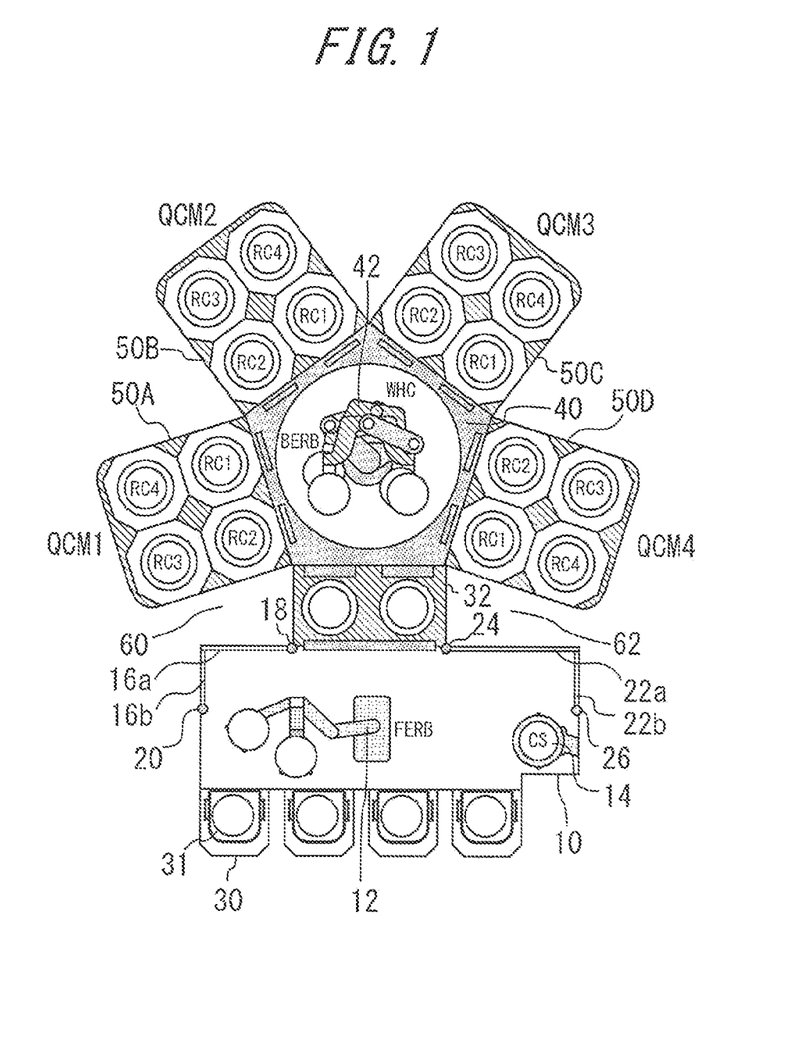
FIG. 1 is a plan view of a substrate processing apparatus according to a first embodiment.

FIG. 1 is a plan view of a substrate processing apparatus according to a first embodiment of the present invention. This substrate processing apparatus is a film forming apparatus. In FIG. 1, internal portions of the substrate processing apparatus are illustrated for ease of description. The substrate processing apparatus is provided with a conveyance chamber 10. The interior of the conveyance chamber 10 is maintained substantially at atmospheric pressure. A robot arm 12 for conveying substrates is provided in the conveyance chamber 10. The ordinary robot arm 12 is called a front end robot (FERB).

The robot arm 12 includes, for example, an upper arm and a lower arm, with which two substrates can be conveyed separately from each other. The robot arm 12 is contained in the conveyance chamber 10. Therefore, the operating range of the robot arm 12 is limited according to the shape of the conveyance chamber 10.

A cooling stage 14 for cooling a substrate is provided in the conveyance chamber 10. The ordinary conveyance chamber is called an equipment front end module (EFEM).

Parts of side walls of the conveyance chamber 10 are movable. More specifically, the side walls of the conveyance chamber 10 include movable parts 16a, 16b, 22a, and 22b. Each of the movable part 16a, 16b, 22a, and 22b is a plate. The movable part 16a is attached to a shaft 18 and is rotatable on this shaft 18. The movable part 16b is attached to a shaft 20 and is rotatable on this shaft 20. The movable part 22a is attached to a shaft 24 and is rotatable on this shaft 24. The movable part 22b is attached to a shaft 26 and is rotatable on this shaft 26.

The movable part 16a and the movable part 16b move like one double door. An end portion of the movable part 16a and an end portion of the movable part 16b are in contact with each other. The interior of the conveyance chamber 10 is thereby isolated from the outside. The movable part 16a and the movable part 16b are perpendicular to each other as viewed in plan. The end portions of the movable part 16a and the movable part 16b may be fixed by a method freely selected. For example, a fixing jig, a latch, fastening with screws or a magnet (referred to generally as a partition key lock) is used. In a case where a magnet is used, the magnet may be provided on one of the movable parts 16a and 16b if the movable parts 16a and 16b are made of iron, or the magnets may be respectively provided on the movable parts 16a and 16b if they are made of aluminum.

Figure 2:
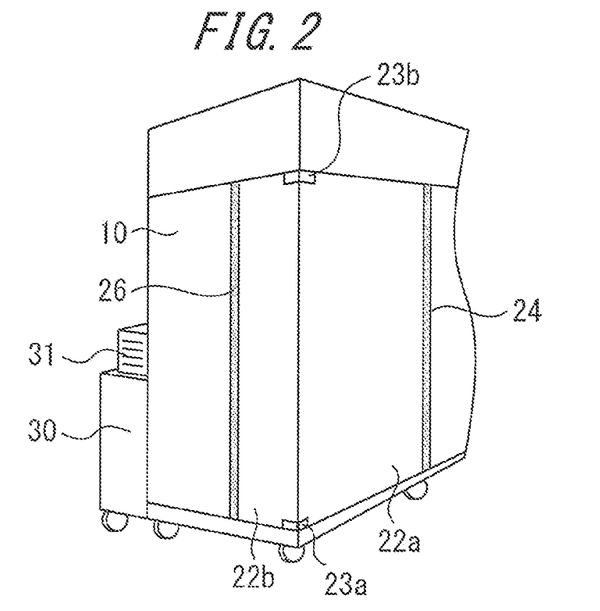
FIG. 2 is a perspective view of the conveyance chamber.

The movable part 22a and the movable part 22b move like one double door. An end portion of the movable part 22a and an end portion of the movable part 22b are in contact with each other. The interior of the conveyance chamber 10 is thereby isolated from the outside. The movable part 22a and the movable part 22b are perpendicular to each other as viewed in plan. FIG. 2 is a perspective view of the conveyance chamber 10 including the movable parts 22a and 22b. L-shaped fixing jigs 23a and 23b are provided at a corner of the conveyance chamber 10. The fixing jigs 23a and 23b are an example of a partition key lock. The fixing jigs 23a and 23b are, although not particularly limited, a magnet for example, as long as it is capable of fixing the movable parts 22a and 22b. One of fixing jigs 23a and 23b may be omitted.

The movable parts 22a and 22b are brought into contact with the fixing jigs 23a and 23b to fix the positions of the movable parts 22a and 22b. The movable parts 16a and 16b can also be fixed by using the same fixing jig as the fixing jigs 23a and 23b.

Referring back to FIG. 1, a load port 30 is attached to a side surface of the conveyance chamber 10. The load port 30 is a table on which a case 31 (FOUP) containing substrates is placed. Four load ports 30 are arranged in a row. The robot arm 12 takes out a substrate from the case 31 or puts a substrate in the case 31.

A load lock chamber 32 is attached to a side surface of the conveyance chamber 10. As is apparent from FIG. 1, the conveyance chamber 10 is positioned between the load lock chamber 32 and the load ports 30. A vacuum chamber 40 is attached to the load lock chamber 32. The ordinary vacuum chamber 40 is called a wafer handling chamber (WHC). A robot arm 42 exists in the vacuum chamber 40. The ordinary robot arm provided in the vacuum chamber is called a back end robot (BERB).

A gate valve is provided between the conveyance chamber 10 and the load lock chamber 32. A gate valve is also provided between the load lock chamber 32 and the vacuum chamber 40. The load lock chamber 32 is provided for the purpose of maintaining a vacuum in the vacuum chamber 40 and preventing the interior of the vacuum chamber 40 from being opened to the atmosphere. The load lock chamber 32 is ordinarily provided with a lower load lock chamber and an upper load lock chamber overlapped with each other.

The periphery of the vacuum chamber 40 is pentagonal in plan view. The above-described load lock chamber 32 is connected to one side surface of the vacuum chamber 40. Quad chamber modules (QCMs 1 to 4) are connected to the other four side surfaces of the vacuum chamber 40. Each QCM is a module having four reaction chambers. One of four side surfaces of the QCM faces the vacuum chamber 40, while the other three side surfaces are constituted by detachable panels or doors so that an operator can access the interior of the QCM when performing a maintenance operation.

The QCMs 1 and 4 adjacent to the conveyance chamber 10 will be referred to as adjacent processing units 50A and 50D. A space 60 exists between the adjacent processing unit 50A and the conveyance chamber 10. In a place where the distance between the adjacent processing unit 50A and the conveyance chamber 10 is minimized, the width of the space 60 is smaller than 600 mm. A space 62 exists between the adjacent processing unit 50D and the conveyance chamber 10. In a place where the distance between the adjacent processing units 50D and the conveyance chamber 10 is minimized, the width of the space 62 is smaller than 600 mm. In a state where the spaces 60 and 62 are narrow as described above, processing (film forming) on substrates with the QCMs 1 to 4 is performed and no maintenance operations are performed on the adjacent processing units 50A and 50D.

The QCMs 2 and 3 not adjacent to the conveyance chamber 10 will be referred to as non-adjacent processing units 50B and 50C. The non-adjacent processing unit 50B is a QCM between the adjacent processing unit 50A and the non-adjacent processing unit 50C. A sufficiently large space exists between the non-adjacent processing unit 50B and the adjacent processing unit 50A, and a sufficiently large space exists between the non-adjacent processing unit 50B and the non-adjacent processing unit 50C. The non-adjacent processing unit 50C is a QCM between the adjacent processing unit 50D and the non-adjacent processing unit 50B. A sufficiently large space exists between the non-adjacent processing unit 50C and the adjacent processing unit 50D, and a sufficiently large space exists between the non-adjacent processing unit 50C and the non-adjacent processing unit 50B. Thus, sufficient spaces for enabling an operator to perform maintenance operations on the non-adjacent processing units 50C and 50D are secured.

Each of the four QCMs has four reaction chambers, as shown in FIG. 1. For example, the adjacent processing unit 50A (QCM 1) has a reaction chamber 1-4. Processing such as plasma processing is performed on a substrate in each reaction chamber.

Figure 3:
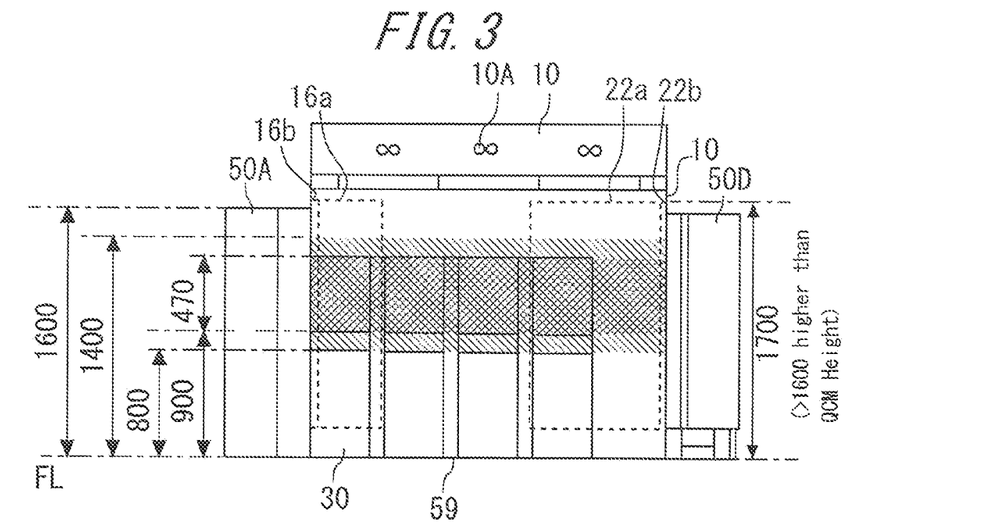
FIG. 3 is a front view of the conveyance chamber.

FIG. 3 is a front view of the conveyance chamber 10 and other components. Fans 10A are provided in an upper section of the conveyance chamber 10. By rotating the fans 10A, downflows from upper positions to lower positions in the conveyance chamber 10 are produced. The robot arm 12 conveys substrates in a region defined between a height of 900 mm from the floor surface 59 and a height of 1370 mm from the floor surface 59. The region defined between 900 mm from the floor surface and 1370 mm from the floor surface 59 is crosshatched in FIG. 3. The robot arm 12 can operate in a region defined between a height of 800 mm from the floor surface 59 and a height of 1400 mm from the floor surface 59. The region defined between 800 mm from the floor surface 59 and 1400 mm from the floor surface 59 is a combination of a crosshatched region and a hatched region in FIG. 3.

The peripheries of the movable parts 16a, 16b, 22a, and 22b are indicated by broken lines. The lower ends of the movable parts 16a, 16b, 22a, and 22b are at a position of, for example, 100 mm from the floor surface 59. The upper ends of the movable parts 16a, 16b, 22a, and 22b are at a position higher than QCMs 1-4. In case where the height of QCM 1-4 is 1600 mm, the height of the upper ends of the movable parts 16a, 16b, 22a, and 22b are, for example, 1700 mm from the floor surface 59. Thus, portions of the movable parts 16a, 16b, 22a, and 22b are at heights at which the robot arm 12 can operate. The positions of the movable parts 16a, 16b, 22a, and 22b are not limited to those defined by the values shown above, if the positions of the lower ends of the movable parts 16a, 16b, 22a, and 22b are below the lower limit of the operating range of the robot arm 12, and if the positions of the upper ends of the movable parts 16a, 16b, 22a, and 22b are above the higher limit of the operating range of the robot arm 12.

Figure 4:
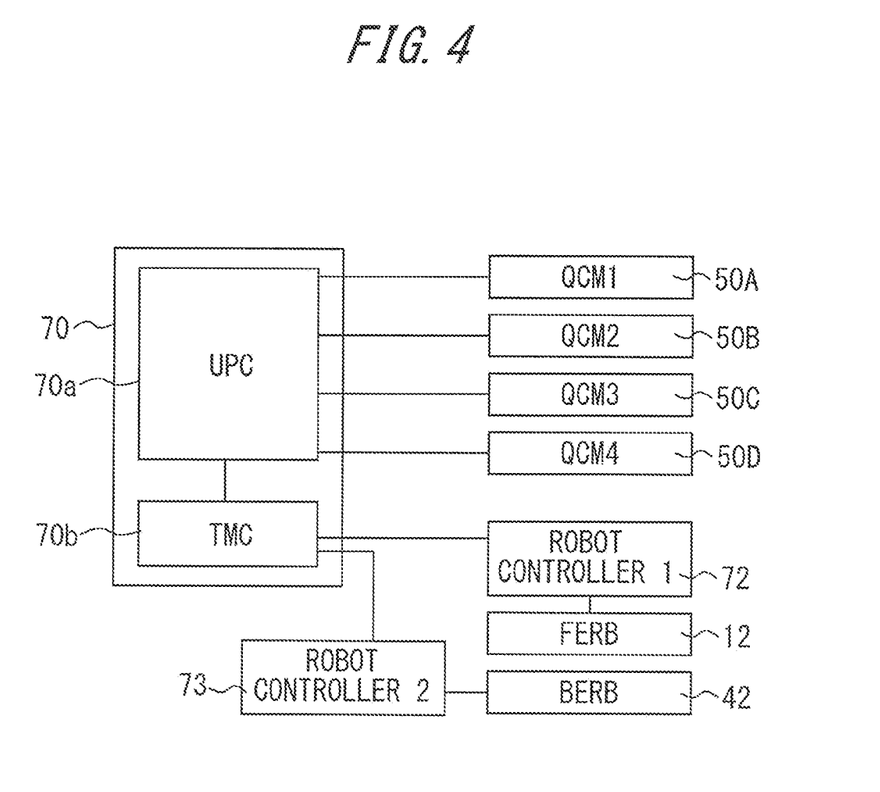
FIG. 4 is a block diagram showing part of a system configuration of the substrate processing apparatus.

FIG. 4 is a block diagram showing part of a system configuration of the substrate processing apparatus. The substrate processing apparatus is provided with a control unit 70. The control unit 70 includes a unique platform controller (UPC) 70a. The UPC 70a is a section for, for example, scheduling substrate processing and commanding execution of substrate processing. In the UPC 70a, data on the configuration of the substrate processing apparatus, a recipe specifying details of processing of substrates and information about environmental settings such as a setting as to execution/nonexecution of alarming and a language setting are stored. The QCMs 1 to 4 (adjacent processing units 50A and 50D and non-adjacent processing units 50B and 50C) are connected to the UPC 70a.

A transfer conveyance module controller (TMC) 70b is connected to the UPC 70a. A robot controller 1(72) and a robot controller 2(73) are connected to the TMC 70b. The robot arm 12 is connected to the robot controller 1(72), and the robot arm 42 is connected to the robot controller 2(73). The robot controllers 1 and 2(72 and 73) are provided, for example, in a lower section or an upper section of the conveyance chamber 10. The TMC 70b receives commands from the UPC 70a and controls the robot controllers 1 and 2(72 and 73) and the robot arms 12 and 42. Other objects to be controlled by the TMC 70b, which are not shown, include the load lock chamber 32 and the gate valve.

A method of processing substrates according to the first embodiment of the present invention will be described. The substrate processing apparatus according to the first embodiment of the present invention processes substrates in a normal mode during a time period when no maintenance operations are performed on the QCMs, and processes substrates in a maintenance mode during a time period when maintenance operations are performed on the QCMs. The normal mode will first be described. In the normal mode, as shown in FIG. 1, the distal end of the movable part 16a and the distal end of the movable part 16b are brought into contact with each other and the distal end of the movable part 22a and the distal end of the movable part 22b are brought into contact with each other. This operation may be performed manually or automatically. Preferably, the movable parts 16a, 16b, 22a, and 22b are fixed with partition key lock, and an operator unfastens the partition key lock by means of a computer or manually only when there is a need to move the movable parts.

The internal space of the conveyance chamber 10 can be maximized by bringing the distal end of the movable part 16a and the distal end of the movable part 16b into contact with each other and bringing the distal end of the movable part 22a and the distal end of the movable part 22b into contact with each other.

Then, the substrates are taken out from the load ports 30 with the robot arm 12 to be put in the load lock chamber 32. Subsequently, the interior of the load lock chamber 32 is evacuated in a state where the gate valve between the conveyance chamber 10 and the load lock chamber 32 is closed. Subsequently, the gate valve between the load lock chamber 32 and the vacuum chamber 40 is opened and the substrates in the load lock chamber 32 are conveyed into the vacuum chamber 40 with the robot arm 42.

Subsequently, the robot arm 42 introduces the held substrates into the QCM (one of the adjacent processing units 50A and 50D and the non-adjacent processing units 50B and 50C). In the QCM, film forming is performed on the substrates. Thus, the substrates are successively introduced into the QCMs from the load ports 30 and film forming is performed on the substrates. In the normal mode, all the four QCMs (the adjacent processing units 50A and 50D and the non-adjacent processing units 50B and 50C) are operated.

The substrates processed in the QCMs are returned to the load ports 30 by performing the above-described process in the reverse direction. More specifically, the substrates are conveyed from the QCMs into the load lock chamber 32 with the robot arm 42 and are returned from the interior of the load lock chamber 32 to the load ports 30 with the robot arm 12.

The operating range of the robot arm 12 is determined by the robot controller 1(72). The robot controller 1(72) limits the operating range of the robot arm 12 to the boundary of the (expanded) internal space of the conveyance chamber 10. The size of the internal space of the conveyance chamber 10 is grasped, for example, by detecting the positions of the movable parts 16a, 16b, 22a, and 22b with detecting parts. That is, the robot controller 1(72) receives information about "expansion of the internal space of the conveyance chamber 10" from the detecting parts and sets wide the operating range of the robot arm 12. The robot arm 12 is then moved freely in the wide internal space. The throughput of the robot arm 12 can thus be improved. For example, the robot arm 12 conveys four hundred substrates in an hour.

There is a need for a QCM maintenance operation in intervals in the course of normal processing by which substrates are successively processed in the normal mode. The maintenance operation is, for example, a periodic maintenance operation executed by a user with an arbitrary frequency or a maintenance operation to be performed in the event of a malfunction of the QCM. For example, a maintenance operation on a reactor is performed about once every two months. Such a maintenance operation is performed by setting the substrate processing apparatus in the maintenance mode.

Figure 5:
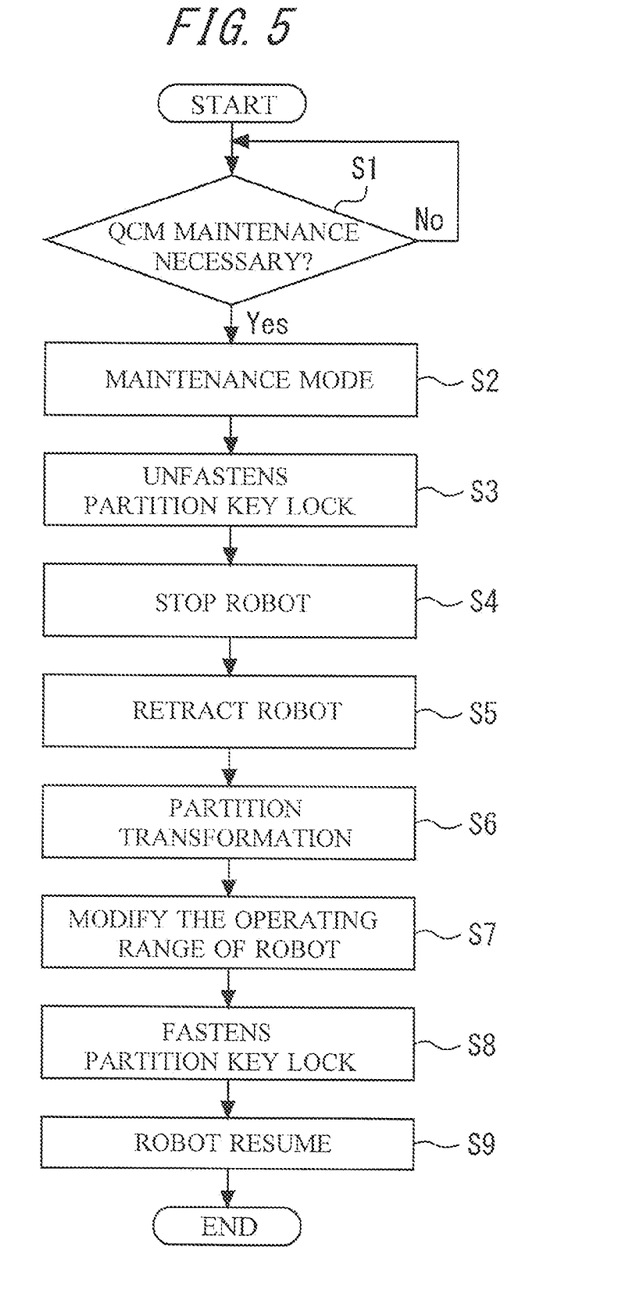
FIG. 5 shows a flowchart.

Functioning for changing from the normal mode to the maintenance mode will be described with reference to FIG. 5. FIG. 5 is a flowchart for explaining functioning for changing the operating mode of the substrate processing apparatus. First, in step S1, determination is made as to whether or not a QCM maintenance operation is required. If a maintenance operation is required, the process advances to step S2. Description will be made by assuming that this required maintenance operation is an operation on the adjacent processing units 50A and 50D. In step S2, the QCMs (adjacent processing units 50A and 50D) are set in the maintenance mode. Use of the adjacent processing units 50A and 50D set in the maintenance mode is prohibited. Supply of substrates to the adjacent processing units 50A and 50D is also prohibited. The QCMs not set in the maintenance mode is maintained in the usable state.

Partition key locks are attached to the movable parts 16a, 16b, 22a, and 22b. When the partition key locks are effective, the movable parts 16a, 16b, 22a, and 22b are fixed. When the partition key locks are unfastened, the movable parts 16a, 16b, 22a, and 22b are made movable.

In step S3, the partition key locks are unfastened. The movable parts 16a, 16b, 22a, and 22b are thereby made movable. Subsequently, in step S4, conveyance operations which are being performed with the robot arms 12 and 42 are completed and the robot arms 12 and 42 are thereafter stopped. In step S5, the robot arms 12 and 42 are moved to retracted positions. The entire robot arm 12 is thereby contained in the conveyance chamber 10, and is contained in the vacuum chamber 40.

Figure 6:
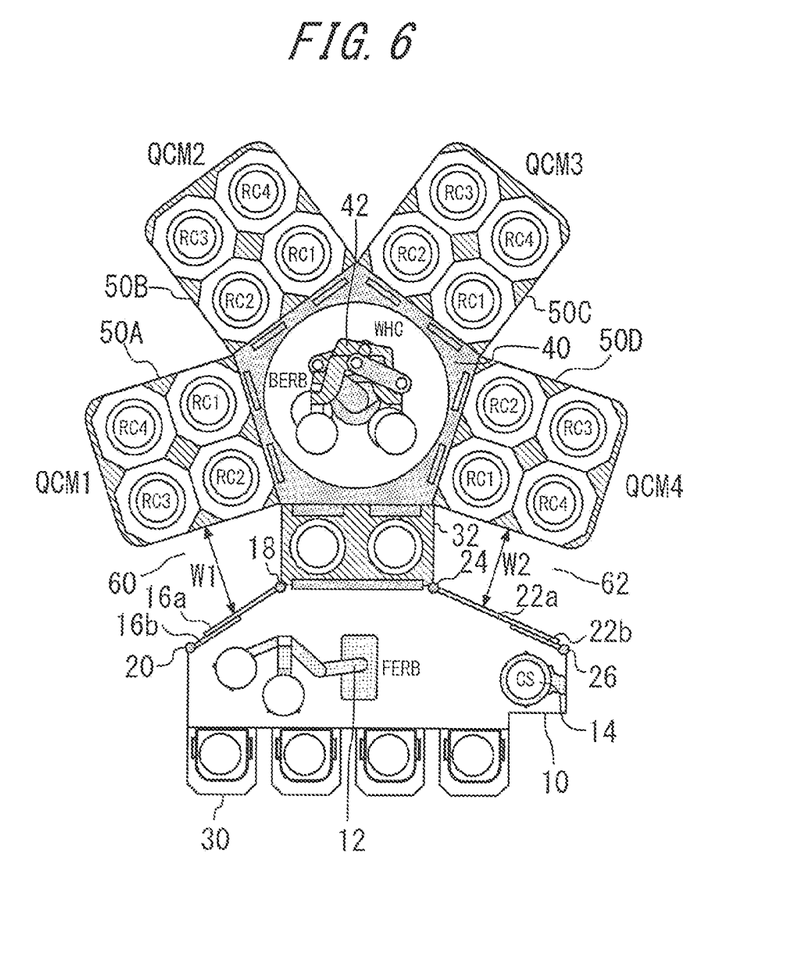
FIG. 6 is a plan view of the substrate processing apparatus.

Subsequently, in step S6, an operator manually or automatically moves the movable parts 16a, 16b, 22a, and 22b. More specifically, a double door having the movable parts 16a and 16b is set in an overlapping state and another double door having the movable parts 22a and 22b is also set in an overlapping state. FIG. 6 is a plan view of the substrate processing apparatus, showing a state where the movable parts overlap each other. A portion of the movable part 16a and a portion of the movable part 16b are superposed on each other and a portion of the movable part 22a and a portion of the movable part 22b are superposed on each other, thereby isolating the interior of the conveyance chamber 10 from the outside.

The movable part 16a and the movable part 16b are parallel to each other and the movable part 22a and the movable part 22b are parallel to each other. A fixing jig, a latch, fastening with screws or a magnet for example is used as a partition key lock for fixing the movable part 16a and the movable part 16b and as a partition key lock for fixing the movable part 22a and the movable part 22b. As is apparent from the comparison between FIGS. 1 and 6, the internal space of the conveyance chamber 10 is reduced when the two movable parts are caused to overlap each other. FIG. 6 illustrates a state where the internal space of the conveyance chamber 10 is minimized.

With the reduction of the internal space of the conveyance chamber 10, the distance between the conveyance chamber 10 and the adjacent processing unit 50A (W1) and the distance between the conveyance chamber 10 and the adjacent processing unit 50D (W2) are increased. The minimum distance between the conveyance chamber 10 and the adjacent processing unit 50A and the minimum distance between the conveyance chamber 10 and the adjacent processing unit 50D can thereby be set, for example, equal to or larger than 610 mm.

Figure 7:
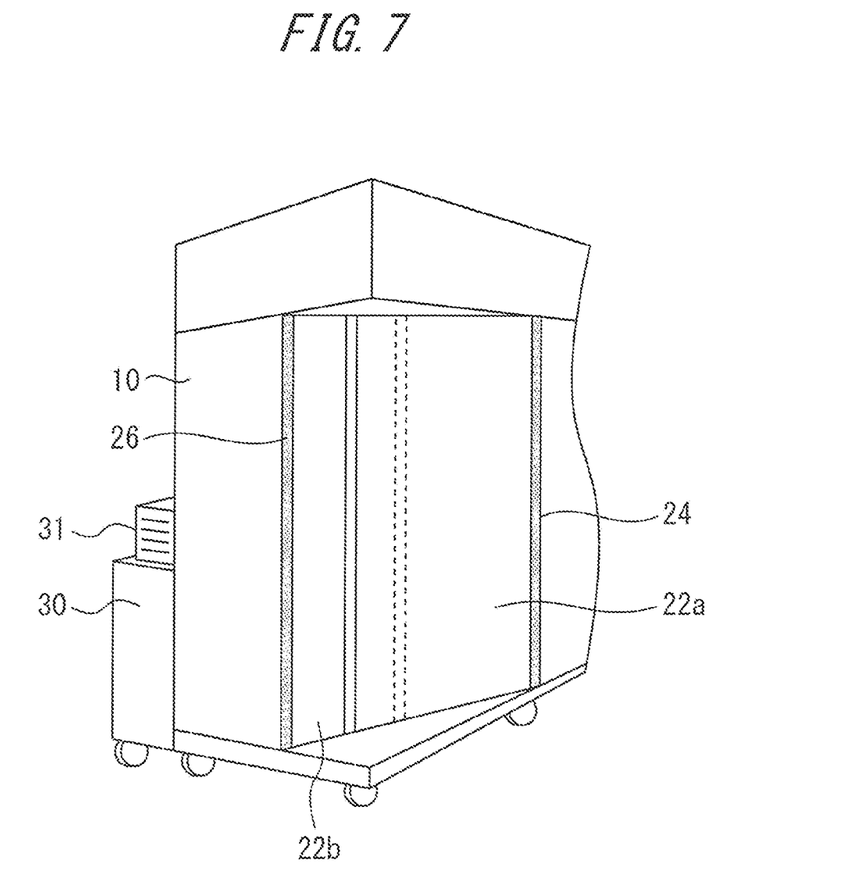
FIG. 7 is a perspective view of the conveyance chamber.

FIG. 7 is a perspective view of the conveyance chamber. The space outside the conveyance chamber 10 can be increased by causing the movable parts to overlap each other.

In step S6, the completion of the change in shape of the partition is detected with the detecting parts. The detecting parts may be of any form as long as they are capable of independently detecting whether the movable parts 16a and 16b overlap each other and the movable parts 22a and 22b overlap each other. The detecting parts are, for example, sensors.

When detecting the overlaps between the movable parts with the detecting parts, the robot controller 1 (72) limits the operating range of the robot arm 12 to the boundary of the (reduced) internal space of the conveyance chamber 10 (step S7). This limitation enables preventing the robot arm 12 from striking against the inner wall of the conveyance chamber 10.

Subsequently, in step S8, the operator makes the partition key locks operative, thereby fixing the movable parts 16a, 16b, 22a, and 22b. After the partition key locks have been made operative, the robot arms 12 and 42 restart operating (step S9).

Preferably, the operating range of the robot arm 12 is automatically reduced, with the movable parts 16a and 16b caused to overlap each other and the movable parts 22a and 22b caused to overlap each other. With the reduction of the operating range of the robot arm 12, the throughput of the robot arm 12 is reduced in comparison with the case where the internal space of the conveyance chamber 10 is large as shown in FIG. 1. For example, the robot arm 12 processes about 370 substrates in an hour.

When the sequence of process steps shown in FIG. 5 ends, the change from the normal mode to the maintenance mode is completed. The robot arms 12 and 42 and the QCMs (adjacent processing units 50A and 50D) set in the maintenance mode are stopped during functioning for the change, as described above. However, processing with the QCMs (non-adjacent processing units 50B and 50C) not set in the maintenance mode is continued. When the substrate processing apparatus is in the maintenance mode after the completion of functioning for change, the adjacent processing units 50A and 50D are maintained in the stopped state and the operations of the non-adjacent processing units 50B and 50C not adjacent to the conveyance chamber 10 are continued. Also, the operations of the robot arms 12 and 42 are restarted. While the operating range of the robot arm 12 is limited, the robot arm 42 operates with the same operating range as that in the normal mode.

In the maintenance mode, the operator performs the maintenance operation on the QCMs while processing on substrates is continued as described above. The operator enters the spaces 60 and 62 made larger than in the process of ordinary processing by setting the movable parts in the overlapping state, and executes the operation necessary for maintenance of the adjacent processing units 50A and 50D. Sufficiently large spacings are provided between the conveyance chamber 10 and the adjacent processing units 50A and 50D, thereby securing the operator's safety. The process in which maintenance processing on the QCMs is performed while processing on substrates is continued is referred to as a maintenance process.

After the completion of the maintenance operation performed by the operator, the substrate processing apparatus is returned to the normal mode. Processing for return to the normal mode is similar to that shown by the flow in FIG. 5. That is, the partition key locks are unfastened and the movable parts 16a, 16b, 22a, and 22b are moved to be set in the state shown in FIG. 1. With this movement of the movable parts, the operating range of the robot arm 12 is increased and establish a state where all the QCMs can be used. Subsequently, the partition key locks are made operative.

The operating range of the robot arm 12 is thus determined in interlock with the movement of the movable parts 16a, 16b, 22a, and 22b, thereby avoiding striking of the robot arm 12 against the conveyance chamber 10 and conveyance of a substrate into the QCM on which a maintenance operation is being performed.

It is preferable to perform programmed control for change to the normal mode or the maintenance mode. That is, it is preferable that the flow shown in FIG. 5 be automatically executed. An example of such automatized processing will be described below. A recording medium on which a program is recorded and which is readable with a computer is prepared in the TMC 70b in advance. An operator notifies the control unit 70 or an external computer that there is a need for a QCM maintenance operation. The operation according to the program is then started. The control unit 70 first sets, for example, the QCMs 1 and 4 (adjacent processing units 50A and 50D) in the maintenance mode (step S2) and unfastens the partition key locks (step S3). Also, the TMC 70b completes processing which is being performed with the robot arms 12 and 42, and moves the robot arms 12 and 42 to the retracted positions (steps S4 and S5). Subsequently, the TMC 70b moves the movable parts 16a, 16b, 22a, and 22b made automatically movable with a motor for example, thereby realizing the state where the spaces 60 and 62 are increased as shown in FIG. 6 (step S6).

In response to detection of the completion of the partition shape change with the detecting parts, an examination step is executed. The examination step is a step of examining whether the conveyance chamber 10 has a first shape or a second shape formed so that the internal space of the conveyance chamber 10 is expanded in comparison with the first shape. For example, the first shape corresponds to a state such as shown in FIG. 6, where the movable parts 16a and 16b overlap each other and the movable parts 22a and 22b overlap each other. The second shape corresponds to a state such as shown in FIG. 1, where the distal ends of the movable parts 16a and 16b are in contact with each other and the distal ends of the movable parts 22a and 22b are in contact with each other.

As a means for examining whether the conveyance chamber has the first shape or the second shape, sensors for detecting the positions of the movable parts, for example, are used.

If the first shape is identified in the examination step, the TMC 70b is made to control the robot arm 12 by setting as an operating region the internal space of the conveyance chamber defined by the first shape. Also, the UPC 70a is made to stop the adjacent processing units 50A and 50D and to continue operating the non-adjacent processing units 50B and 50C. Stoppage of the adjacent processing units 50A and 50D, executed in step S2, may alternatively be executed at this stage.

On the other hand, if the second shape is identified in the examination step, the robot arm 12 is controlled by setting as an operating region the internal space of the conveyance chamber 10 defined by the second shape. Also, all the processing units (adjacent processing units 50A and 50D and non-adjacent processing units 50B and 50C) are operated.

The process step in which processing is performed according to the result of examination in the examination step as described above is referred to as a control step. The program recorded on the recording medium causes the computer to execute the above-described steps including the examination step and the control step (Step S7). Thereafter, the steps S8 and S9 are executed to complete the change to the maintenance mode. The change from the maintenance mode to the normal mode can also be program-controlled.

The substrate processing apparatus, the recording medium and the substrate processing method according to the embodiment of the present invention can be variously modified. For example, the maintenance process is characterized in that substrates are conveyed by the robot arm in the conveyance chamber 10 while a maintenance operation is being performed on the adjacent processing units, with the conveyance chamber 10 being in a state of having the first shape, i.e., a state where a predetermined space is provided between the conveyance chamber 10 and the adjacent processing units. The above-described arrangement may be changed as desired as long as this feature is not lost. For example, the movable parts are not limited to those moving like a double door. The first shape is not limited to the shape of the movable parts shown in FIG. 6.

The normal process is characterized in that substrates are conveyed by the robot arm in the conveyance chamber 10 while substrates are being processed by the adjacent processing units, with the conveyance chamber 10 being in a state of having the second shape, i.e., a state where the internal space of the conveyance chamber 10 is increased by reducing the distances between the conveyance chamber and the adjacent processing units in comparison with the first shape. The above-described arrangement may be changed as desired as long as this feature is not lost. For example, the second shape is not limited to the shape of the movable parts shown in FIG. 1.

Figure 8:
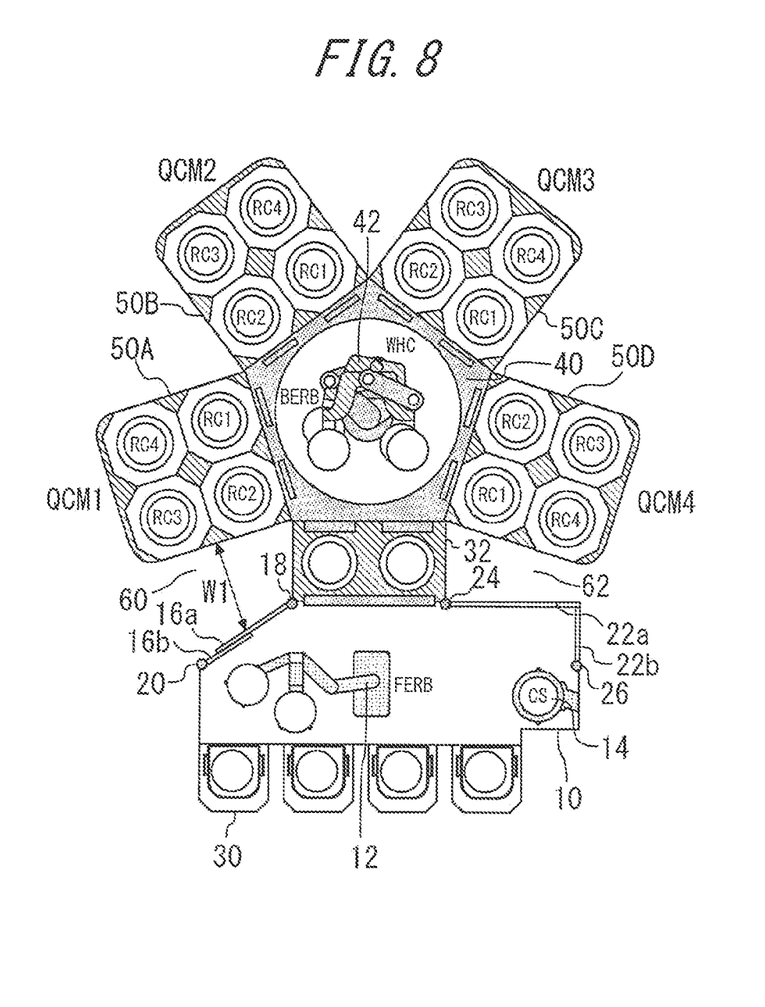
FIG. 8 is a plan view of the substrate processing apparatus.

In the first embodiment, the above-described first shape is realized by setting in an overlapping state the double door constituted by the movable parts 16a and 16b and setting in an overlapping state the double door constituted by the movable parts 22a and 22b, and the second shape is realized by bringing the ends of the double doors into contact with each other. However, the internal space of the conveyance chamber 10 can be increased by bringing the distal ends of the movable parts 22a and 22b into contact together as shown in FIG. 8 in a case where there is a need for a maintenance operation on the adjacent processing unit 50A while there is no need for any maintenance operation on the adjacent processing unit 50D. The internal space of the conveyance chamber 10 shown in FIG. 8 is larger than the internal space of the conveyance chamber 10 shown in FIG. 1. Therefore, the throughput can be improved by setting the operating range of the robot arm 12 in correspondence with the internal space of the conveyance chamber shown in FIG. 8.

Figure 9:
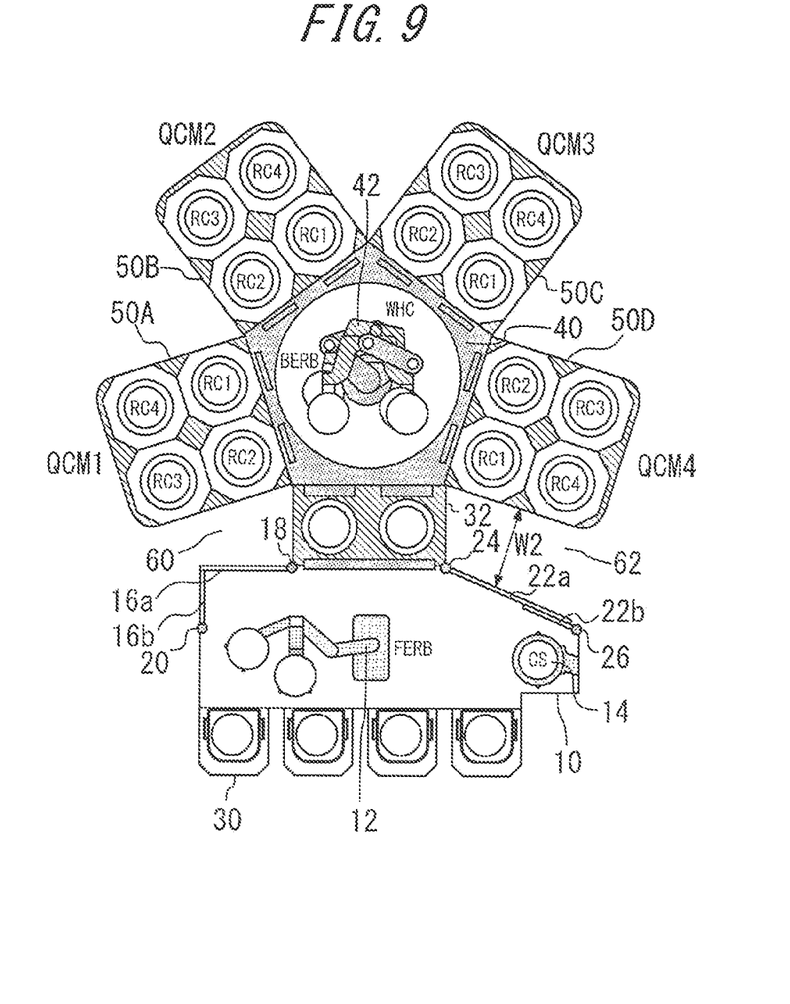
FIG. 9 is a plan view of the substrate processing apparatus.

On the other hand, the internal space of the conveyance chamber 10 can be increased by bringing the distal ends of the movable parts 16a and 16b into contact with each other as shown in FIG. 9 in a case where there is a need for a maintenance operation on the adjacent processing unit 50D while there is no need for any maintenance operation on the adjacent processing unit 50A. Also in this case, the throughput can be improved by setting the operating range of the robot arm 12 in correspondence with the internal space of the conveyance chamber shown in FIG. 9. Thus, the internal space of the conveyance chamber 10 can take four patterns shown in FIGS. 1, 6, 8, and 9.

As mentioned above, setting the operating range of the robot arm 12 in correspondence with the internal space of the conveyance chamber 10 is necessary for improved throughput. Preferably, each of these four patterns is associated with the corresponding operating range of the robot arm 12. Such relationship data may stored in the recording medium.

In order to select one pattern among four patterns, position of movable parts 16a, 16b, 22a, and 22b are detected by sensors (detecting parts). For example, a sensor that detects superposition of two movable parts is provided in the portion where two movable parts overlaps. Another sensor that detects contact between two distal ends of the movable parts is provided in the portion where two distal ends contact. Physically, these two sensors may be integrated into one sensor.

TMC 70b receives outputs of the sensors and determines the pattern of the internal space of the conveyance chamber 10. Subsequently, TMC 70b identify the operating range of the robot arm 12 corresponding to determined pattern based on the relationship data stored in the recording medium. Finally, TMC 70b drives robot arm 12 within the identified operating range of the robot arm 12. A program causing the computer (control unit 70) to execute such a series of operation may be stored in the recording medium. Such operation is applicable to the substrate processing apparatus having a conveyance chamber constructed so as to be able to have a plurality of patterns. In other words, the number of pattern is not limited to four.

Even after the overlap between the movable parts 22a and 22b is caused to increase the spaces between the adjacent processing units and the chamber 10 as shown in FIG. 7, a lower end portion and an upper end portion of the conveyance chamber 10 are still close to the adjacent processing unit. If the upper end portion and the lower end portion are a hindrance to a maintenance operation on the adjacent processing unit when the operator performs the maintenance operation, it is preferable to make these portions detachable or to exclude these portions from the beginning. In other words, the difference between the first shape and the second shape (of the conveyance chamber) is provided through the entire portion of the conveyance chamber opposed to the adjacent processing unit.

If the upper end portion and the lower end portion of the conveyance chamber are not any hindrance to the maintenance operation, the provision of the difference between the first shape and the second shape only through the height range in which the robot arm 12 operates, which range is the same as that in the description of the first embodiment, suffices.

The conveyance chamber 10 has been constructed so as to be able to have the first shape for provision of the predetermined space between the conveyance chamber 10 and the adjacent processing unit and the second shape formed so that the internal space of conveyance chamber 10 is expanded by reducing the distance between the conveyance chamber 10 and the adjacent processing unit in comparison with the first shape. Thus, the second shape is used in the normal mode to maximize the throughput of the robot arm 12, and the first shape is used in the maintenance mode to secure a sufficiently large space between the conveyance chamber and the adjacent processing unit. This is one of the important features of the present invention.

The QCMs 1 to 4 may be replaced with different modules as long as the modules are capable of processing on substrates. For example, dual chamber modules (DCMs) may alternatively be provided. While a film forming apparatus has been described by way of example as substrate processing apparatus, the arrangement of the present invention is also effective in a substrate processing apparatus such as an etcher. These modifications can be applied as desired to substrate processing apparatuses, recording mediums and substrate processing methods according to embodiments described below. The substrate processing apparatuses, recording mediums and substrate processing methods according to the embodiments described below have many commonalities with those according to the first embodiment and will therefore be described mainly with respect to points of difference from the first embodiment.

Second Embodiment

Figure 10:
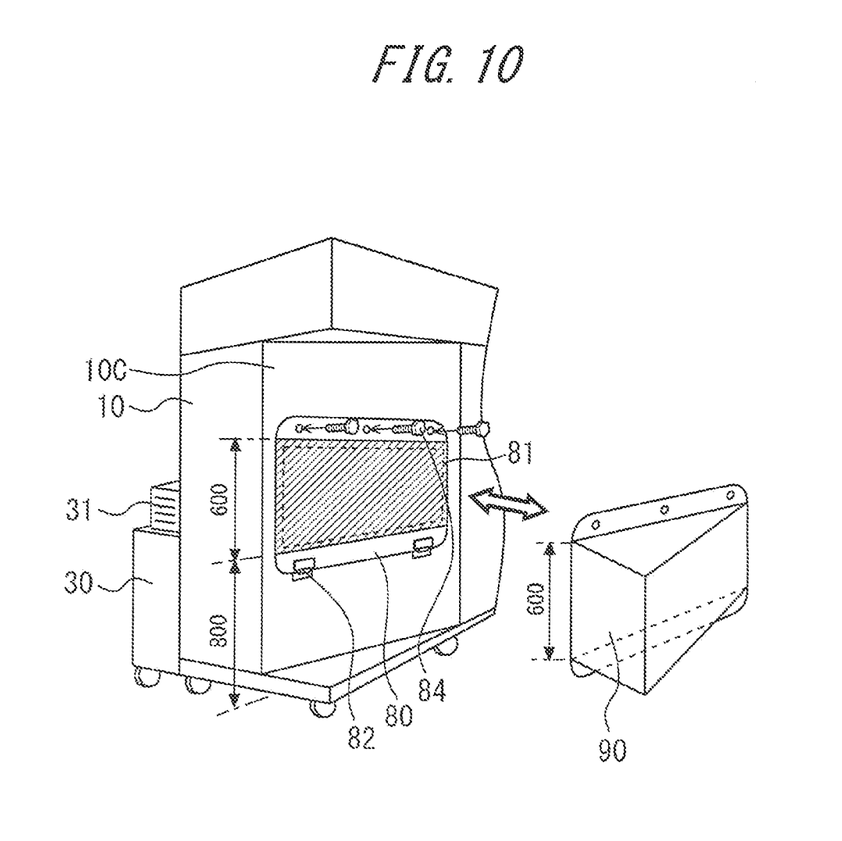
FIG. 10 is a perspective view of the conveyance chamber according to the second embodiment.

In the first embodiment, each of the portions of the conveyance chamber opposed to the adjacent processing units is formed of a double door. In the second embodiment, a detachable member is provided on each of portions of the conveyance chamber opposed to the adjacent processing units. FIG. 10 is a perspective view of the conveyance chamber according to the second embodiment. Each of portions of the conveyance chamber 10 opposed to the adjacent processing units is a receding portion 10C. The spacing between the receding portion 10C and the adjacent processing unit is set, for example, equal to or larger than 600 mm, thereby securing the operator's safety.

A hole 81 indicated by a broken line is formed in the receding portion 10C. The hole 81 is provided in an area including heights of 800 to 1400 mm from the floor surface where the robot arm 12 is movable. If the hole 81 is not closed, the interior and the outside of the conveyance chamber 10 communicate with each other through the hole 81. A detachable plate 80 for closing the hole 81 is provided on the receding portion 10C, thereby realizing a first shape (shape for a maintenance operation).

A lower end portion of the plate 80 is supported by receiving members 82 attached to the receding portion 10C. Holes are provided in an upper end portion of the plate 80. The plate 80 is fixed on the receding portion 10C with screws 84 passed through these holes.

At the time of transition to the normal mode in which no maintenance operation is performed on the adjacent processing unit, the plate 80 is detached from the receding portion 10C. A recessed partition wall 90 is provided on the portion of the conveyance chamber opposed to the adjacent processing unit, thereby closing the hole 81. The recessed partition wall 90 is a member attached to the receding portion 10C by the same method as the plate 80, and detachable from the receding portion 10C. The recessed partition wall 90 projects toward the adjacent processing unit.

The recessed partition wall 90 has a sunken shape like a vessel. The sunken portion (recessed portion) of the recessed partition wall 90 is opposed to the hole 81. Therefore, the internal space of the conveyance chamber 10 is increased by an amount corresponding to this recessed portion in comparison with the case of attaching the plate 80. The throughput of the robot arm can be improved by adding this increased internal space to the operating range of the robot arm 12. A second shape is realized by installing the recessed partition wall 90 on the receding portion 10C.

Thus, transition to the normal mode or the maintenance mode can easily be made by only attaching the plate 80 or the recessed partition wall 90 to the conveyance chamber 10 at a partition shape change stage. The shape of the recessed partition wall 90 can be changed as required. For example, if the amount of projection of the recessed partition wall 90 toward the adjacent processing unit is increased, the operating range of the robot arm 12 can be correspondingly extended.

Third Embodiment

Figure 11:
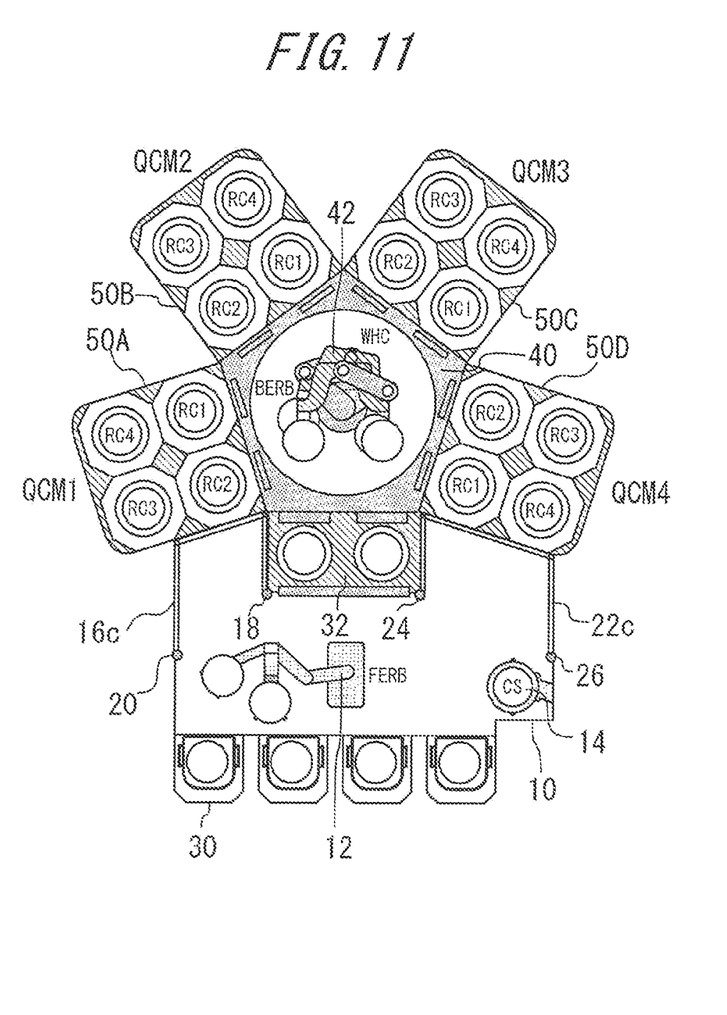
FIG. 11 is a plan view of the substrate processing apparatus according to the third embodiment.

FIG. 11 is a plan view of the substrate processing apparatus according to the third embodiment. A feature of this substrate processing apparatus resides in the second shape (the shape of the conveyance chamber in the normal mode in which no maintenance operation is performed). Portions of the conveyance chamber 10 opposed to the adjacent processing units 50A and 50D are movable parts 16c and 22c. The movable parts 16c and 22c respectively contact the adjacent processing units 50A and 50D. The movable parts 16c and 22c are detachable from the main body of the conveyance chamber 10. The movable parts 16c and 22c may alternatively be constructed so as to be retractable.

In improving the throughput of the robot arm 12, expanding the internal space of the conveyance chamber 10 in the directions of the QCMs is important. In the third embodiment of the present invention, the internal space of the conveyance chamber 10 can be expanded in the directions of the QCMs by means of the movable parts 16c and 22c, thus enabling to improve the throughput of the robot arm 12. In the maintenance mode, the movable parts 16c and 22c are removed or retracted to secure spaces substantially equal to the spaces 60 and 62 shown in FIG. 6.

According to the present invention, the shape of a side surface of the conveyance chamber can be changed. Therefore, a sufficiently large spacing can be provided between the conveyance chamber and the processing unit during a time period when a maintenance operation is performed on the processing unit, and the throughput of the robot arm can be increased during other time periods.

Obviously many modifications and variations of the present invention are possible in the light of the above teachings. It is therefore to be understood that within the scope of the appended claims the invention may be practiced otherwise than as specifically described.

What is claimed is:

1. A substrate processing apparatus comprising:
a robot arm for conveying a substrate;
a conveyance chamber containing the robot arm, the conveyance chamber including a side having a surface, a rotatable first wall having an end rotatably attached to the side of the conveyance chamber at a first fixed location on the conveyance chamber and movable between a first position and a second position while attached to the conveyance chamber, and a rotatable second wall rotatably attached to the conveyance chamber at a second fixed location, the second wall movable with respect to the first wall and to the conveyance chamber; and
an adjacent processing chamber adjacent to the conveyance chamber, the adjacent processing chamber processing a substrate therein,
wherein the conveyance chamber is constructed so as to have a first shape for providing a predetermined space between the conveyance chamber and the adjacent processing chamber when the first wall is in the first position, the predetermined space including a distance between the first wall and the adjacent processing chamber, and a second shape for increasing the internal space of the conveyance chamber by making the distance between the first wall and the adjacent processing chamber smaller than when the first shape is formed when the first wall is in the second position, and
wherein the first wall and the second wall overlap when the first wall is in the first position and the first wall and the second wall intersect at a non-zero angle when the first wall is in the second position.

2. The substrate processing apparatus according to claim 1, wherein the first wall and the second wall form a double door;
the first shape is realized by setting the double door in an overlapping state; and
the second shape is realized by bringing end portions of the double door into contact with each other.

3. The substrate processing apparatus according to claim 1, further comprising:
a load lock chamber attached to the side surface of the conveyance chamber; and
a load port attached to a second side surface of the conveyance chamber,
wherein the load lock chamber is connected between the conveyance chamber and the adjacent processing chamber, and
wherein the conveyance chamber is positioned between the load lock chamber and the load port.

4. The substrate processing apparatus according to claim 1, wherein the difference between the first shape and the second shape is produced at a height at which the robot arm operates.

5. The substrate processing apparatus according to claim 1, wherein the difference between the first shape and the second shape is produced by the portion of the conveyance chamber that opposes the adjacent processing chamber when in the first shape.

6. The substrate processing apparatus according to claim 1, further comprising:
a plurality of movable parts, including at least the first wall, that can project toward the adjacent processing chamber;
a sensor that detects the position of the plurality of movable parts;
a recording medium storing relationship data which associates the pattern of the internal space of the conveyance chamber with the operating range of the robot arm; and
a transfer conveyance module controller (TMC) that receives output of the sensor and determines the pattern, the TMC identifies the operating range of the robot arm corresponding to the determined pattern based on the relationship data stored in a recording medium.

7. The substrate processing apparatus of claim 1, including a vacuum chamber, wherein the conveyance chamber is connected to the vacuum chamber and the adjacent processing chamber is connected to the vacuum chamber.

8. The substrate processing apparatus of claim 7, including a load lock chamber connected to the conveyance chamber and the vacuum chamber.

9. The substrate processing apparatus of claim 8, including a plurality of processing chambers arrayed around a periphery of the vacuum chamber.

* * * * *